WITNESSES
Theodore T. Wrobel
James F. Young

INVENTOR
Larry J. Pollock
BY Gordon H. Telfer
ATTORNEY

United States Patent Office 3,299,329

Patented Jan. 17, 1967

3,299,329

SEMICONDUCTOR STRUCTURES PROVIDING BOTH UNIPOLAR TRANSISTOR AND BIPOLAR TRANSISTOR FUNCTIONS AND METHOD OF MAKING SAME

Larry J. Pollock, Greensburg, Pa., assignor to Westinghouse Electric Corporation, Pittsburgh, Pa., a corporation of Pennsylvania Filed July 5, 1963, Ser. No. 292,880
5 Claims. (Cl. 317—235)

This invention relates generally to semiconductor structures for providing the functions of a plurality of conventional components within a unitary body of semiconductive material and, more particularly, a such structures for providing the functions of both a unipolar transistor and a bipolar transistor.

In the art of integrated circuitry or molecular electronics, to which the present invention relates, the functions of a plurality of conventional components such as transistors, diodes, resistors and capacitors are provided within a unitary body of semiconductive material. In some instances it is desired that an integrated circuit include both a unipolar (or field effect) transistor structure and a bipolar transistor structure. An example of such an instance is that in which a bipolar transistor amplifier is biased and driven by a unipolar transistor as described in copending application Serial No. 197,975, filed May 28, 1962 by Lin and Yu, now Patent 3,210,677, and assigned to the assignee of the present invention. This copending application discloses that the unipolar and bipolar structures may be fabricated by substantially identical operations including two diffusions into a substrate or into an epitaxial layer on a substrate so as to form substantially identical three-layer structures. The portion of the device providing bipolar transistor functions includes a diffused base region and a diffused emitter region of opposite semiconductivity type to the base region. The portion providing unipolar transistor functions includes a diffused channel region and a diffused gate region of opposite semiconductivity type thereto. The channel and gate regions of the unipolar hence have the same characteristics as the base and emitter regions, respectively, of the bipolar transistor. Such a structure is convenient because of the possibility of simultaneous formation of unipolar and bipolar transistor devices. However, a structure wherein the unipolar channel necessarily has the same characteristics as the diffused base region is a disadvantage since a unipolar channel region and a bipolar base region require different characteristics for optimum performance. Also, unipolar devices with a diffused channel are subject to several limitations.

For example, when the channel region of the unipolar transistor is diffused, an impurity gradient in that region necessarily results. The depth of diffusion must be carefully controlled since the saturation current of the device is proportional to the 5th power of the channel thickness in a diffused channel.

In addition, the voltage limitation (the source to drain voltage at which current control is lost) is determined by surface conditions. Since a diffused channel has a relatively high surface concentration, a relatively low voltage limitation results. Consequently, in a unipolar-bipolar device, separate power supplies for each type of device may be required so that the voltage limitation of the unipolare device is not exceeded.

The double diffused structure also results in inherently increased input capacitance and lower input impedance because of the high impurity concentration at the gate junction compared to the considerably lower average concentration throughout the channel region.

It is required in the double diffused structure that the channel region be very thin which further makes fabrication control difficult.

It is, therefore, an object of the present invention to provide a semiconductor structure providing both unipolar transistor and bipolar transistor functions.

Another object is to provide unipolar transistor structures and bipolar transistor structures within a unitary body of semiconducive material with improved characteristics without sacrificing fabrication convenience.

Another object is to provide an improved method of fabricating a semiconductor structure including both a unipolar transistor and a bipolar transistor.

Another object is to provide an improved method of fabricating a unipolar-bipolar transistor structure wherein the unipolar transistor channel region is formed independently of the bipolar transistor base region.

The invention, in brief, achieves the above-mentioned and other objects by providing a semiconductor structure within a unitary body of semiconductive material wherein a layer of uniform resistivity material, preferably formed by epitaxial growth, serves as the channel region of the unipolar transistor and part of the collector region of the bipolar transistor. One structure in accordance with this invention comprises a substrate of one type of semiconductivity having a first region (floating gate region) of a second type of semiconductivity in one surface thereof and a layer of semiconductive material of the first type extending over that surface and the first region. In addition, a region (isolation wall) of the second type extends from the first region through the layer to the free surface thereof so as to enclose a first portion of the layer (channel region) and to electrically isolate it from other portions. A second region (gate region) of the second type is disposed in the first portion of said layer so that the unipolar structure is formed. In another portion of the layer a third region of material (base region) of the second type is disposed with a fourth region (emitter region) thereon of the first type to provide a bipolar transistor structure wherein the layer and the substrate cooperate to provide a collector region.

Formation of the layer above referred to by epitaxial growth, while the outer regions are produced by diffusion of impurities or by a combination of diffusion and epitaxial growth operations, results in a device wherein the channel of the unipolar transistor may have a uniform resistivity. Consequently, devices may be more readily reproduced. The diffusion operation by which the base region of the bipolar transistor and the gate region of the unipolar transistor are formed presents no difficulty since both regions may have the same characteristics. The bipolar transistor characteristics are enhanced by use of the epitaxially grown layer, which has a relatively high resistivity, as part of the collector thereof. The result is a transistor of NPIN PNIP type which has very good power handling capabilities and good frequency response.

The present invention, both as to its structure and method of fabrication, together with the above mentioned and further objects and advantages thereof, may best be understood by referece to the following description, taken in connection with the accompanying drawings, in which.

Figure 1:
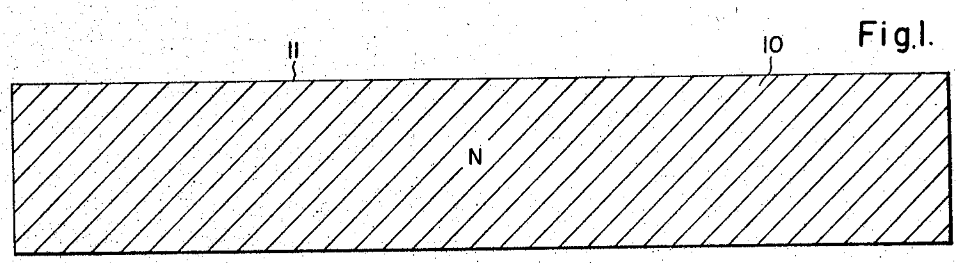
FIGURES 1 through 7 are side views, in cross section, of a semiconductor structure in accordance with this invention at various stages in the fabrication process.

Referring to FIG. 1, a suitable starting material or substrate 10 is shown. The starting material 10 is an essentially monocrystalline body of semiconductive material and may be formed by the known crystal growing techniques. The substrate 10 may, for example, be a section of a single crystal semiconductive rod pulled from a melt comprised of the semiconductive material and at least one suitable doping impurity. Also, the starting material may be a section of a dendritic semiconductive crystal formed by the method set forth in Patent 3,031,403 by A. I. Bennett, Jr., issued April 24, 1962. The substrate 10 has a major surface 11 which is planar and which has sufficient area for the subsequent fabrication of function performing regions thereon. The thickness of the substrate should be sufficient to provide the desired degree of mechanical stability in the structure.

The invention is advantageously carried out on a wafer of material having a diameter of 1 to 2 inches or more with simultaneous fabrication of a large number of identical devices which are then separated. In the description of this invention, the fabrication of single devices will be primarily discussed.

Silicon or another semiconductive material, such as germanium or a III–V compound, such as gallium arsenide, may be employed for the starting material. In the following discussion which is illustrative of the practice of this invention, the starting material 10 will be described as being of silicon since silicon is readily available and the individual process techniques such as epitaxial growth, oxide masking and impurity diffusion are better known for silicon than for other semiconductive materials. Also, merely by way of illustration, the substrate is designated as being of N type semiconductivity although the semiconductivity type of the various regions may be reversed from that shown. The substrate is doped with donor type impurities to provide an average resistivity of from about 0.1 ohm-centimeters to about 3 ohms-centimeters. Since it is desired to form a layer of epitaxially grown material on the major surface 11 of the substrate 10, it will be convenient for the major surface 11 to be close to <111> orientation, which for silicon is readily commercially available, since the techniques for epitaxial growth on such a surface are well known and readily practiced although epitaxial grown on other surfaces may be performed.

Figure 2:
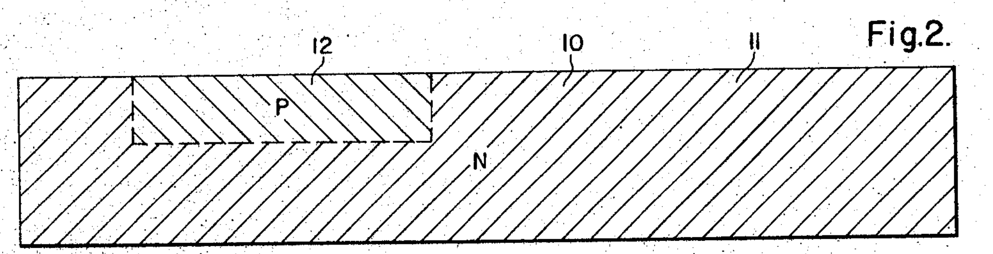

FIG. 2 shows the structure after a first region 12 of semiconductive material of opposite semiconductivity type to that of the substrate is formed therein, hence forming a p-n junction. The first region serves as a floating gate region in the completed device, that is, it is of opposite semiconductivity type to that of the unipolar channel but, generally, no signal is applied thereto. It is preferably formed by the diffusion of an acceptor type impurity, such as boron, into the major surface of the substrate in a selective manner. For example, an oxide diffusion mask may be formed such as by thermally oxidizing the substrate and selectively removing portions of the oxide layer by photoresist masking and etching techniques so that an opening is formed in the position where the floating gate region is desired. Well known techniques for impurity diffusion are suitable for the formation of the floating gate region. The diffusion is performed to provide a surface concentration in the range of from about $5\times10^{16}$ atoms per cubic centimeter to about $5\times10^{18}$ atoms per cubic centimeter with a depth of diffusion of from about 4 microns to about 10 microns. Removal of a thin layer of material from the surface 11 so that the remaining region 12 has a thickness of from about 1 to 4 microns is advantageous to minimize out-diffusion during subsequent operations. The oxide diffusion masks employed in the fabrication of the illustrative devices of this invention are not shown in the drawing for simplicity.

Figure 3:
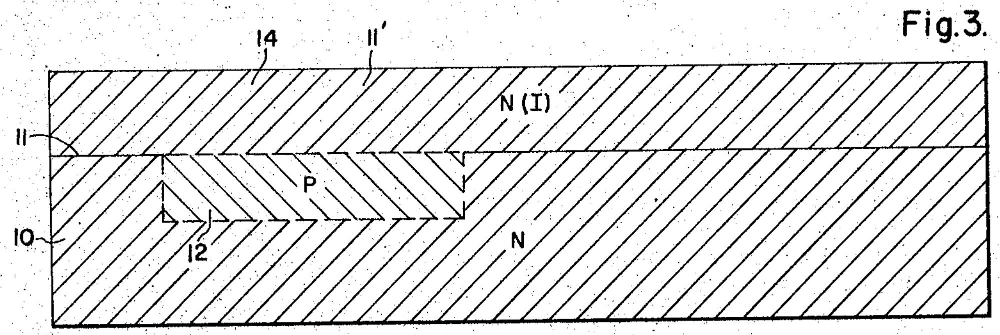

FIG. 3 shows the structure after an epitaxial layer 14 has formed on the major surface 11 of the substrate extending over the floating gate region 12. The epitaxial layer is a monocrystalline extension of the substrate and may, in general, be formed by the thermal decomposition of the compound of the semi-conductive material such as the reduction of silicon tetrachloride by hydrogen at a temperature of about 1200° C.

A doping impurity is supplied with the gaseous reactants to provide the desired type of semiconductivity which in the illustrative example is N type. For purposes of the present invention, the epitaxial layer 14 preferably has a substantially uniform resistivity (±20%) within the range of from about 0.5 ohm-centimeter to about 20 ohm-centimeters and a uniform thickness (±10%) in the range of from about 3 microns to about 10 microns.

Since the resistivity of the epitaxial layer 14 is generally greater than that of the substrate 10, and hence the epitaxial layer is more intrinsic than the substrate, it is designated N(I) in the drawing. Since the epitaxial layer 14 is a monocrystalline extension of the substrate 10, it has a planar major surface 11′.

Figure 4:
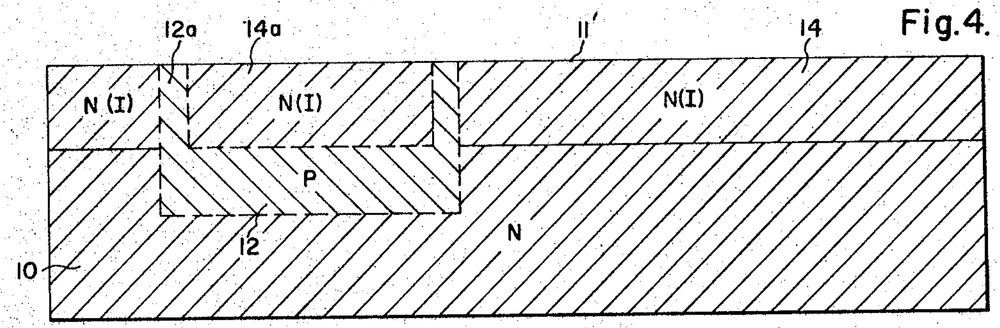
Figure 8:
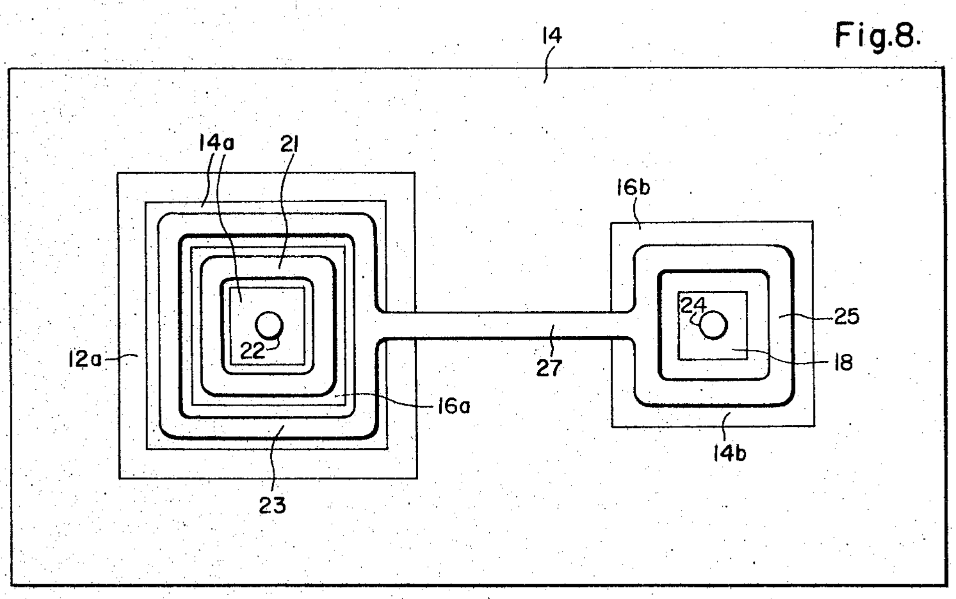
FIGURE 8 is a plan view of the semiconductor structure shown in FIG. 7.

FIG. 4 shows the structure after there has been formed by diffusion an isolation wall **12*a* extending through the epitaxial layer 14 to the floating gate region 12 and enclosing a first portion 14*a* of the epitaxial layer 14 (also see FIG. 8). The isolation wall 12*a* is of the same semiconductivity type as the floating gate region 12**. The diffusion of the isolation wall may be performed in a manner similar to that for the diffusion of the floating gate region, also using an oxide diffusion mask, the only necessary requirement being that the diffused portion of the epitaxial layer be converted to P type semiconductivity. For this purpose, diffusion to a surface concentration of from about $5\times10^{19}$ atoms per cubic centimeter to about $5\times10^{20}$ atoms per cubic centimeter is suitable.

Figure 5:
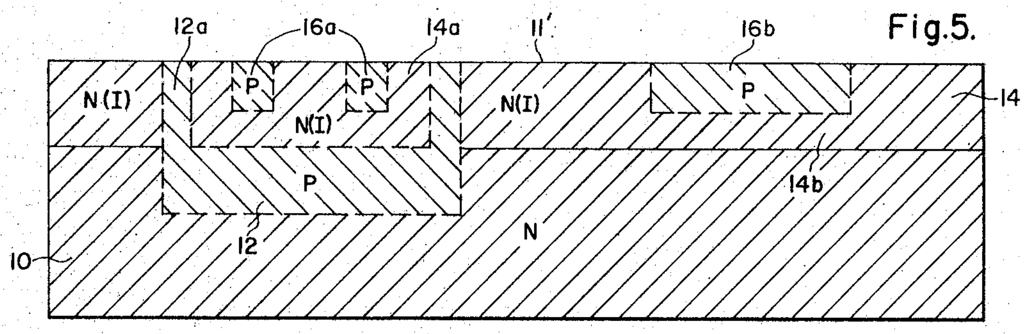

In FIG. 5, the structure is shown after two more P type regions **16*a* and 16*b* have been formed by diffusion. The second region 16*a* of P type semiconductivity is disposed within the first portion 14*a* of the epitaxial layer 14 enclosed by the isolating wall 12*a* and is here shown as being in a continuous open rectangular configuration (also see FIG. 8). Simultaneously with the formation of the second region 16*a*, a third region 16*b* is formed in a second portion 14*b* of the epitaxial layer 14. The third region 16*b*** has a rectangular configuration.

The second P type region **16*a* serves as the gate region of the unipolar transistor while the third P type region 16*b*** serves as the base region of the bipolar transistor. The diffusion of the second and third regions may be carried out in the same general manner as for the floating gate region. The depth of digusion of the second and third regions may be in the range of from about 1 micron to about 5 microns with a surface concentration in the range of from about $5\times10^{17}$ atoms per cubic centimeter to about $10^{19}$ atoms per cubic centimeter.

Figure 6:
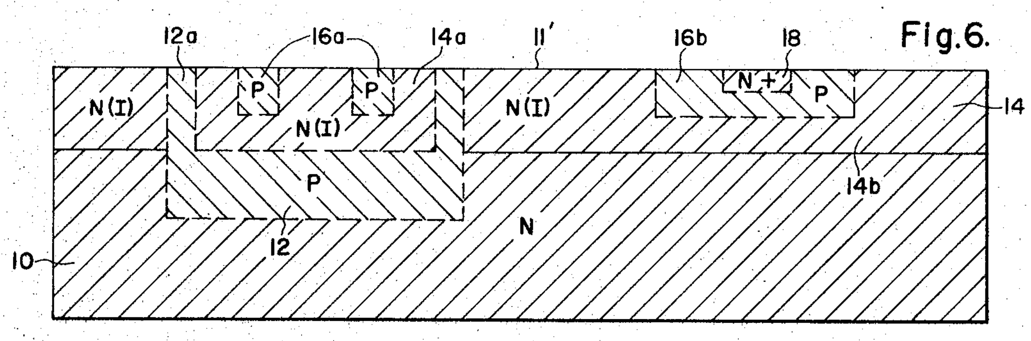

FIG. 6 shows the structure after the diffusion of a fourth region 18, this region being of N type semiconductivity, disposed in the transistor base region **16*b* for the purpose of providing a bipolar transistor emitter region. This diffusion may be performed using an impurity such as phosphorus through a suitable oxide mask formed in accordance with the known techniques to a surface concentration in the range of from about $10^{19}$ atoms per cubic centimeter to about $10^{21}$ atoms per cubic centimeter and a thickness of from about 0.5 micron to about 3.5 microns. Since the emitter region 18** is so highly doped, it is shown in the drawing as being of N+ type semiconductivity.

Figure 7:
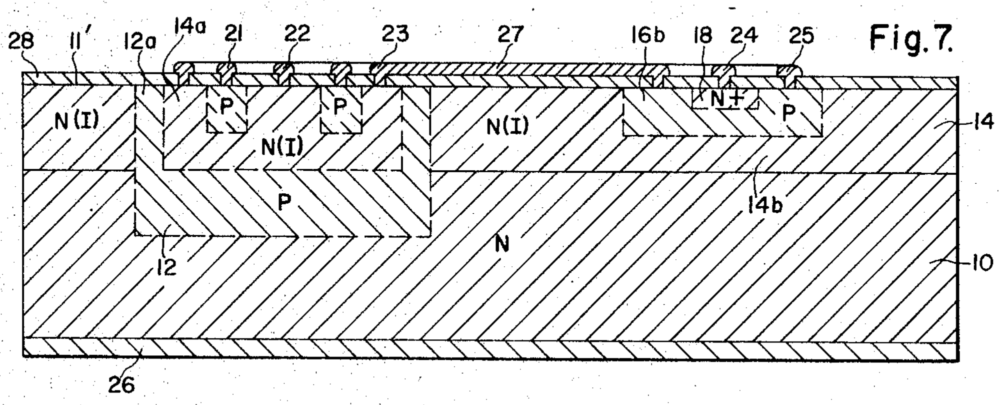

In FIG. 7 the structure of FIG. 6 is shown with electrical contacts disposed on each of the functional regions. The gate region **16*a* of the unipolar transistor has an ohmic contact 21 thereon. The source and drain contacts 22 and 23 of the unipolar transistor are, respectively, within the opening formed by the gate region 16*a* and extending around the outside periphery of the gate region. In the bipolar transistor an ohmic contact 24 is made on the emitter region and an ohmic contact 25 on the base region by a contact which substantially surrounds the emitter region 18. The contact 26 for the collector region (provided by portion 14*b* of the epitaxial layer and by the substrate 10) may be applied over the lower surface of the substrate. The contact for the collector may also be made on the upper surface of the device, for example by the diffusion of an N+ ring around the base region 16*b* during the same operation as that in which the emitter region 18 is formed with subsequent alloying of an ohmic contact thereto. The ohmic contacts 21, 22, 23, 24 and 25 to the upper surface of the device may be conveniently formed by the evaporation of aluminum in a vacuum followed by alloying. The aluminum forms an ohmic, rather than rectifying, contact to the emitter region 18 because of the high impurity concentration of that region. The portions of the upper surface to which no contact is to be formed are all protected by an insulating layer 28 such as of silicon dioxide which may be formed in the same manner as for the diffusion masks. Where the collector contact 26** is made to the lower surface, as shown, it may conveniently be formed by alloying an alloy of gold with a small amount of donor type impurity such as antimony or another suitable alloy may be employed.

FIG. 7 also shows a conductive interconnection 27 between the contact 23 of the unipolar transistor and the base contact 25 of the bipolar transistor. The conductive interconnection may conveniently be formed in the same operation as that in which the contacts 21, 22, 23, 24 and 25 are formed but instead of making contact with the semiconductive material is insulated therefrom by the oxide layer 28.

FIG. 8 shows a plan view of the device of FIG. 7 with the exclusion of the oxide layer 28 so that the geometry of the semiconductive regions may be illustrated.

Figure 9:
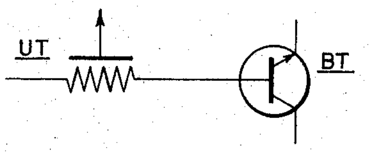
FIGURE 9 is a schematic diagram of the approximate equivalent circuit of the device of FIGS. 1 to 8.

FIG. 9 shows the approximate equivalent circuit of the device for the fabrication as illustrated in FIGS. 1 to 8. The device is equivalent to a unipolar transistor UT having a P type gate region and an N type channel whose drain (or source) contact is conductively coupled to the base region of an N-P-N bipolar transistor BT. The floating gate region 12 of the unipolar transistor provides electrical isolation between the two portions of the device.

It is to be understood that in the practice of this invention, devices may be fabricated which include a plurality of unipolar transistor portions and a plurality of bipolar transistor portions. The particular geometry of the devices may be varied in accordance with unipolar and bipolar transistor practice. Also there may be included within the same unitary body of semiconductive material other components such as diodes, capacitors, and resistors fabricated in accordance with known techniques.

Figure 10:
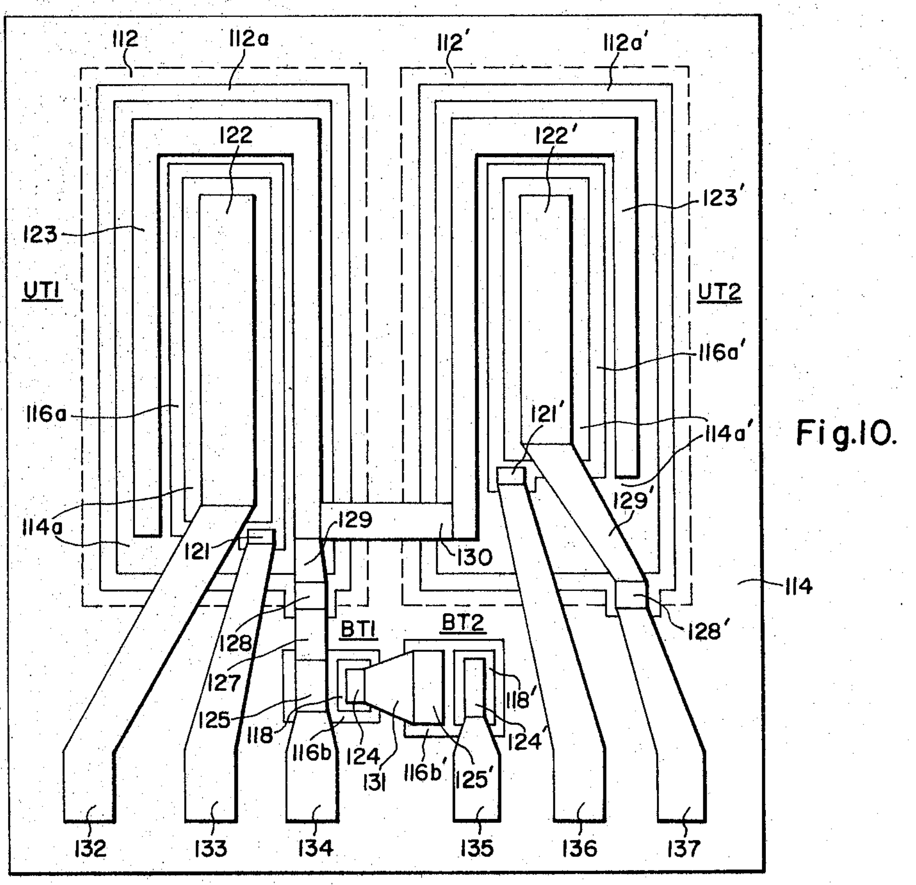
FIGURE 10 is a plan view of a semiconductor structure further illustrating the present invention.

FIG. 10 illustrates a device incorporating two unipolar transistors and two bipolar transistors. FIG. 10 is a drawing of a successfully made and operated device and is to scale (1 inch equals 12.6 mils). Each of the two unipolar transistor structures UT1 and UT2 includes, respectively, a floating gate region 112 and 112', isolation walls **112*a* and 112*a'*, channels 114*a* and 114*a'* of portions of epitaxial layer 114, gate 116*a* and 116*a'*, gate contact 121 and 121' and source and drain contacts 122 and 123 for UT1 and source and drain contacts 122' and 123' for UT2. Each of the bipolar transistors BT1 and BT2 has, respectively, a base region 116*b* and 116*b'*, emitter region 118 and $118_2$, emitter contact 124 and 124' and base contact 125 and 125'. The substrate serves as the collector and contact is made to the under surface of the device for the output. In addition, contact is made to each of the isolation walls of the unipolars by contact 128 on UT1 and contact 128' on UT2. The additional contacts 128 and 128' may be used for the application of an additional gate signal or, as in most cases, used for connection to the source contact for some greater stability in operation. Hence, conductive interconnections 129 and 129' are provided, respectively, between contacts 128 and 123 and contacts 128' and 122'. Additionally, interconnection 130 connects contacts 123 and 123', interconnection 127 connects contacts 128 and 125 and interconnection 131 connects contacts 124 and 125'. Conductive areas 132, 133, 134, 135, 136 and 137** are connected to various ones of the contacts so that leads may be affixed at the periphery of the device. The conductive areas and interconnections are all insulated from the semiconductive material by an oxide layer (not shown).

Figure 11:
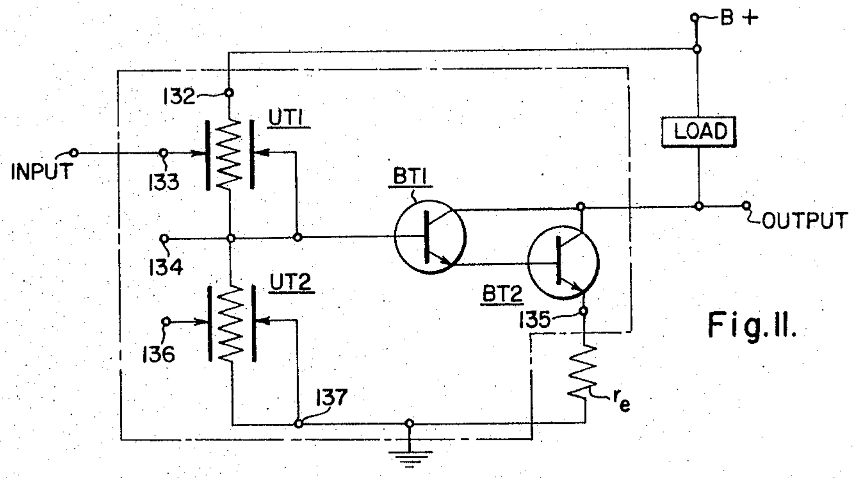
FIGURE 11 is a schematic diagram of a circuit, shown by way of example, wherein devices in accordance with this invention, such as that of FIG. 10, may be used advantageously.

The result is a device which constitutes an integration of the circuit shown in FIG. 11 within the dot-dash line which includes a first unipolar transistor UT1 driving a pair of bipolar transistors BT1 and BT2 cascaded to form a Darlington type of amplifier. The second unipolar transistor UT2 serves to bias the bipolar transistors. Each unipolar transistor has its source shorted to the floating gate region. The emitter resistance, $r_e$, if required, could also be formed as part of the same semiconductor device as the transistors by known integrated circuit techniques. The conductive areas 134 and 136 were provided for the testing of device characteristics. This circuit is that shown and described in the above-referred to copending application by Lin and Yu and reference thereto should be made for further information on the purposes and operation of this circuit.

Devices in accordance with this invention have been found to have improved unipolar transistor characteristics compared with those formed by double diffusion techniques. This is primarily the result of the use of a substantially uniform doped epitaxial layer having a relatively high resistivity for the channel region of the unipolar transistors.

As a consequence of the constant resistivity channel region the static parameters of the unipolar device now vary only with the third power of the channel thickness instead of with the fifth power. The impurity concentration at the gate junction may be low so that the voltage limit is now in excess of 100 volts compared with 12 to 18 volts for devices with diffused channels. Also, the input capacitance is reduced as a result of the lower impurity concentration at the gate junction.

Aside from improved performance, devices in accordance with this invention are also advantageous for convenience in fabrication. Not as high a degree of control is necessary as in the double diffused structures since the channel region of the unipolar is now of the same material as that comprising the collector region of the bipolar transistors.

Two hundred fifty devices like that shown in FIG. 10 were simultaneously fabricated on a substrate of N-type silicon which was a section of a grown single crystal doped with antimony to provide a resistivity of about 2 ohm-centimeters. The substrate had a diameter of about three-fourths inch and a thickness of about 7 mils.

The diffusion operations were performed using an oxide ($SiO_2$) mask formed by thermal oxidation. The first diffusion for the floating gate regions was performed by first depositing a boron source on the exposed silicon. For this purpose, an inert carrier gas comprising hydrogen and nitrogen was bubbled through boron tribromide, maintained at about 20° *C.*, and supplied to the chamber containing the silicon for about 15 minutes. The silicon was heated to a temperature about 950° C. during deposition by inductively heating a graphite member on which the silicon was supported. Following the deposition, the boron was diffused into the silicon by heating to about 1160° C. for about 16 hours. This step was performed in an oxygen and water vapor atmosphere so that an oxide layer was simultaneously formed on the silicon surface. This procedure produced diffused regions having a depth of about 9 microns and a surface concentration of about $10^{18}$ atoms per cubic centimeters.

Following the first diffusion about 6 microns of the upper surface were removed by etching with HCl vapor at about 1275° C. for about 10 minutes.

The growth of the epitaxial layer was performed by the reduction of silicon tetrachloride with hydrogen, with arsene ($AsH_3$) providing the doping impurity. Typically, the following quantities of reactants were supplied while heating the silicon to about 1215° C. for about 10 minutes: 26 liters per minute of hydrogen; $32\times10^{-4}$ mols per minute of silicon tetrachloride; and 100 cubic centimeters per minute of a mixture of 50 cc. commercially available arsene doped hydrogen (50 parts arsene per million) and 3000 cc. hydrogen. The resulting epitaxial layer had a resistivity of about 1.5 to 2.0 ohm-centimeters and a thilckness of about 7 microns.

For the second diffusion to form the isolation walls, boron was used as described for the formation of the floating gate regions with the impurity deposition performed at 1125° C. for 15 minutes and the diffusion at 1215° C. for 16 hours. Diffused regions extending through the epitaxial layer and having a surface concentration af about $10^{19}$ to $10^{20}$ atoms per cubic centimeter was thereby achieved.

The diffusion for the unipolar gate regions and the bipolar base regions was performed in similar manner. The impurity deposition was performed at 950° C. for 15 minutes and the diffusion at 1160° C. for 2 hours resulting in regions having a depth of about 3.5 microns and a surface concentration of about $10^{18}$ atoms per cubic centimeter.

The diffusion for the n-type bipolar emitters was performed in a similar diffusion set up as that described for the p-type regions with phosphorous oxychloride as the impurity suorce. Deposition was performed at 1150° C. for 15 minutes and diffusion at 1100° C. for 3 minutes in an atmosphere containing water vapor and then for 5 minutes in an atmosphere containing no moisture. The resulting regions had a depth of about 2.3 microns and a surface concentration of about $10^{20}$ atoms per cubic centimeter.

Figure 12:
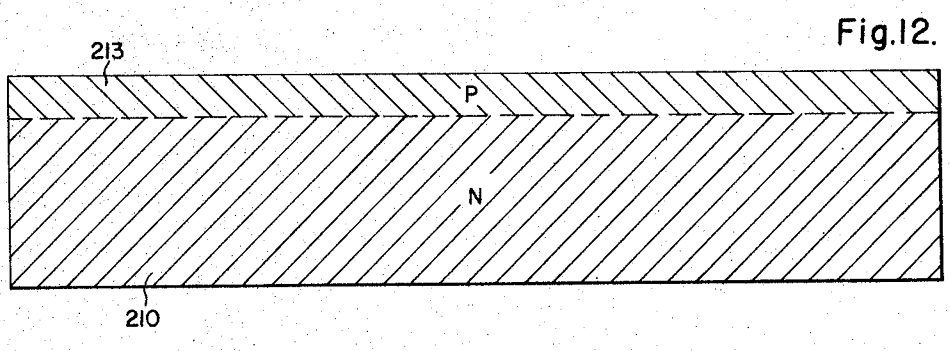
FIGURES 12 to 14 are side views, in cross section, of a semiconductor structure in accordance with another embodiment of this invention at various stages in the fabrication process.
Figure 13:
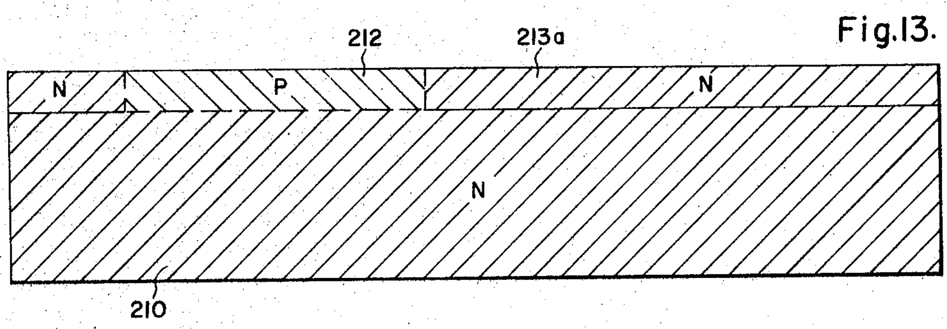
Figure 14:
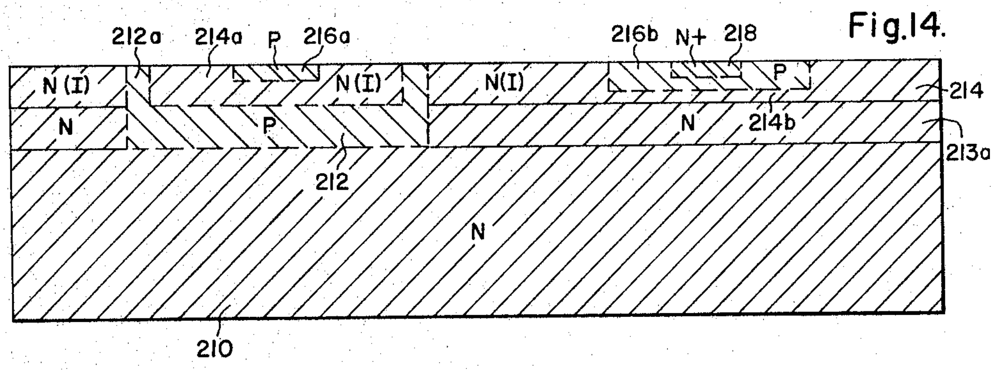

FIGS. 12 to 14 show a structure in accordance with another embodiment of this invention at various stages of the fabrication process.

In FIG. 12, the substrate 210, which may be like the substrate 10 of FIGS. 1 to 7, has thereon a layer 213 of p-type epitaxially grown material. FIG. 13 shows the structure after the layer, except for a portion 212, has been converted by diffusion to n-type material designated 213*a*. Such a diffusion may be performed using a conventional oxide mask. FIG. 14 shows the structure after completion of the semiconductive regions. Over the surface of the first layer of epitaxial material is disposed a second layer 214 of N(I) type like layer 14 of FIGS. 1 to 7. Subsequent fabrication may be the same as in the previous example with diffusion of the isolating wall 212*a*, diffusion of the unipolar gate region 216*a* and the bipolar base region 216*b* and diffusion of the bipolar emitter region 218.

The structure of FIG. 14 has the advantage of providing a floating gate region 212 of relatively low concentration, since it is of epitaxial material, compared to that of the diffused floating gate region 12 of FIG. 7. Hence during the subsequent fabrication steps, out-diffusion which results in the introduction of impurities in the channel region 214*a* is minimized. Out-diffusion from the diffused portion 213*a* of the first epitaxial layer does not present a problem since an impurity, such as arsenic, may be selected for the diffusion of portion 213*a* which has a very low diffusion constant.

Devices were made as shown in FIGS. 12 to 14 with the p-type epitaxial layer 213 (1.8 microns; 2.5 ohm-cm.) formed by using diborane ($B_2H_6$) as the impurity. Otherwise the process was similar to that for the n-type epitaxial layer previously described. Arsenic diffusion was used to form the n-type material 213*a* using $A_sO_3$ as the impurity source. The surface concentration was about $10^{19}$ atoms per cubic cm. Subsequent fabrication was like that previously described for the device of FIG. 10.

While the present invention has been shown and described in a few forms only, it will be apparent that various changes and modifications may be made without departing from the spirit and scope thereof.

I claim as my invention:

1. A semiconductor structure capable of providing the functions of a unipolar transistor and a bipolar transistor comprising: a unitary body of semiconductive material including a substrate of a first type of semiconductivity; a first region of semiconductive material of a second type of semiconductivity in a portion of a first surface of said substrate and forming a p-n junction therewith; a layer of semiconductive material of said first type of semiconductivity extending over said first region and said first surface of said substrate outside said first region; an isolation wall of semiconductive material of said second type of semiconductivity extending from said first region through said layer and enclosing a first portion thereof; a second region of semiconductive material of said second type disposed in p-n junction forming relationship with said first portion of said layer; a third region of semiconductive material of said second type disposed in p-n junction forming relationship with a second portion of said layer; and a fourth region of semiconductive material of said first type of semiconductivity disposed in p-n junction forming relationship with said third region so that said first portion of said layer and said first and second regions of semiconductive material form a semiconductive structure capable of operating as a unipolar transistor and said second portion of said layer and said third and fourth semiconductive regions form a structure capable of operating as a bipolar transistor.

2. A semiconductor structure in accordance with claim 1 wherein: said layer of semiconductive material is in monocrystalline relationship with said subsrtate and has a substantially uniform resistivity.

3. A semiconductor structure in accordance with claim 1 wherein: said layer is in monocrystalline relationship with said substrate and has a uniform resistivity within the range of from about 0.5 ohm-centimeters to about 20 ohm-centimeters.

4. A semiconductor structure in accordance with claim 1 further comprising: first and second electrical contacts on said first portion of said layer; a third electrical contact disposed on said second region; and fourth, fifth and sixth electrical contacts respectively disposed on said substrate, said third region and said fourth region.

5. A semiconductor structure in accordance with claim 4 wherein: one of said first and second electrical contacts and said fifth electrical contact are conductively interconnected.

References Cited by the Examiner

UNITED STATES PATENTS

| | | | |
|---|---|---|---|
| 2,763,581 | 9/1956 | Freedman | 148—1.5 |
| 2,802,760 | 8/1957 | Derick | 148—1.5 |
| 3,070,762 | 12/1962 | Evans | 333—70 |
| 3,108,914 | 10/1963 | Hoerni | 148—186 |
| 3,131,098 | 4/1964 | Krsek | 148—175 |
| 3,138,747 | 6/1964 | Stewart | 317—235 |
| 3,150,299 | 9/1964 | Noyce | 317—235 |
| 3,177,414 | 4/1965 | Kurosawa et al. | 317—235 |
| 3,197,710 | 7/1965 | Lin | 330—38 |
| 3,210,677 | 10/1965 | Lin et al. | 330—17 |

JOHN W. HUCKERT, *Primary Examiner.*

M. EDLOW, *Assistant Examiner.*